(12) United States Patent
Chen et al.

(10) Patent No.: US 11,367,402 B2
(45) Date of Patent: Jun. 21, 2022

(54) EOA CIRCUIT, DISPLAY PANEL, AND TERMINAL

(71) Applicant: Shenzhen Royole Technologies Co., Ltd., Shenzhen (CN)

(72) Inventors: Dan Chen, Shenzhen (CN); Jiha Kim, Shenzhen (CN)

(73) Assignee: Shenzhen Royole Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/338,963

(22) Filed: Jun. 4, 2021

(65) Prior Publication Data
US 2021/0312870 A1    Oct. 7, 2021

Related U.S. Application Data

(60) Provisional application No. PCT/CN2018/119554, filed on Dec. 6, 2018.

(51) Int. Cl.
*G09G 3/3266* (2016.01)
*G09G 3/36* (2006.01)

(52) U.S. Cl.
CPC ......... *G09G 3/3266* (2013.01); *G09G 3/3677* (2013.01); *G09G 2310/0232* (2013.01); *G09G 2310/08* (2013.01)

(58) Field of Classification Search
CPC ................ G09G 3/3266; G09G 2310/0286
See application file for complete search history.

(56) References Cited

U.S. PATENT DOCUMENTS

| | | | |
|---|---|---|---|
| 10,586,494 B2* | 3/2020 | Bong | G11C 19/186 |
| 2015/0138180 A1* | 5/2015 | Park | G09G 3/3233 345/212 |
| 2017/0098413 A1* | 4/2017 | Lee | G11C 19/186 |
| 2017/0116925 A1* | 4/2017 | Lee | G11C 19/28 |
| 2017/0116926 A1* | 4/2017 | Bong | G09G 3/3266 |
| 2017/0154572 A1* | 6/2017 | Kim | G09G 3/3266 |

* cited by examiner

*Primary Examiner* — Sepehr Azari
(74) *Attorney, Agent, or Firm* — Carter, DeLuca & Farrell LLP; George Likourezos

(57) ABSTRACT

The present disclosure relates to an EOA circuit, a display panel, and a terminal. The EOA circuit includes an output module and a control module; wherein the output module is configured to generate an output signal according to a first scanning signal and a clock signal, and the output module is further configured to reset the output signal from a high level to a low level within a period where the first scanning signal is an active level and a period where the clock signal is an inactive level; and the control module is configured to restore the output signal from the low level to the high level according to a second scanning signal within a period where the first scanning signal is at the inactive level.

20 Claims, 6 Drawing Sheets

EOA CIRCUIT, DISPLAY PANEL, AND TERMINAL

CROSS-REFERENCE TO RELATED APPLICATION

This application is a continuation application of International (PCT) Patent Application No. PCT/CN2018/119554, filed on Dec. 6, 2018, and entitled "EOA Circuit, Display Panel, and Terminal," the entire contents of which are incorporated herein by reference.

TECHNICAL FIELD

The present disclosure relates to the technical field of display, and in particular, relates to an EOA circuit, a display panel, and a terminal.

BACKGROUND

Organic light-emitting diodes (OLEDs), as a type of current-type light-emitting devices, have merits such as self-luminescence, wide view angle, extremely-high contrast, lower power consumption, and extremely fast response and the like, and are widely used in the field of display technologies.

An OLED display panel needs to be driven by a scanning drive signal supplied by a scanning drive circuit. The scanning drive circuit is mainly constituted by a GOA (gate D-IC on array) circuit and an EOA (emission D-IC on array) circuit. The EOA circuit is only at a low level in a data input stage, and at a high level in all other stages. That is, in the data input stage, the EOA circuit is in a turn-off state and does not output signals, data signals output by a drive IC enters from a drive transistor, to achieve input of the data signals.

A conventional EOA circuit generally employs an 8T1C (eight transistors and one capacitor) structure, meanwhile, also needs four first clock signal (ECLK) lines and two second clock signal (ECLKB) lines. FIG. 1 illustrates a circuit diagram of an 8T1C EOA circuit. This EOA circuit mainly includes a pull-up control module, a pull-up output module, a pull-down control module, and a pull-down output module. As illustrated in FIG. 1, this circuit structure, during layout, needs to occupy a larger space, which is unfavorable to narrow-frame design.

SUMMARY

In view of the above, the present disclosure provides an EOA circuit, the EOA circuit includes:

an output module, configured to generate an output signal according to a first scanning signal and a clock signal; wherein the output module is further configured to reset the output signal from a high level to a low level within a period where the first scanning signal is at an active level and a period where the clock signal is at an inactive level; and a control module, configured to restore the output signal from the low level to the high level according to a second scanning signal within a period where the first scanning signal is at the inactive level.

The present disclosure further provides a display panel. The display panel includes an EOA circuit disposed in a border region, wherein the EOA circuit includes: an output module, configured to generate an output signal according to a first scanning signal and a clock signal; wherein the output module is further configured to reset the output signal from a high level to a low level within a period where the first scanning signal is at an active level and a period where the clock signal is at an inactive level; and a control module, configured to restore the output signal from the low level to the high level according to a second scanning signal within a period where the first scanning signal is at the inactive level.

The present disclosure further provides a terminal. The terminal includes the display panel with the EOA circuit disposed in the border region of the display panel, wherein the EOA circuit includes: an output module, configured to generate an output signal according to a first scanning signal and a clock signal; wherein the output module is further configured to reset the output signal from a high level to a low level within a period where the first scanning signal is at an active level and a period where the clock signal is at an inactive level; and a control module, configured to restore the output signal from the low level to the high level according to a second scanning signal within a period where the first scanning signal is at the inactive level.

With the EOA circuit according to the present disclosure, since a simple circuit structure is employed, a layout size of the EOA circuit is greatly reduced, layout of the circuit occupies a small space, which is greatly favorable to narrow-frame design and may be widely applied to display panels requiring the narrow-frame design.

BRIEF DESCRIPTION OF THE DRAWINGS

For clearer descriptions of the embodiments of the present disclosure, drawings that are to be referred for description of the embodiments are briefly described hereinafter. Apparently, the drawings described hereinafter merely illustrate some embodiments of the present disclosure. Persons of ordinary skill in the art may also derive other drawings based on the drawings described herein without any creative effort. Among the drawings.

DETAILED DESCRIPTION

The technical solutions in the embodiments of the present disclosure are described in detail clearly and completely hereinafter with reference to the accompanying drawings for the embodiments of the present disclosure. Apparently, the described embodiments are only a portion of embodiments of the present disclosure, but not all the embodiments of the present disclosure. Based on the embodiments of the present disclosure, all other embodiments derived by persons of ordinary skill in the art without any creative efforts shall fall within the protection scope of the present disclosure.

Figure 2:
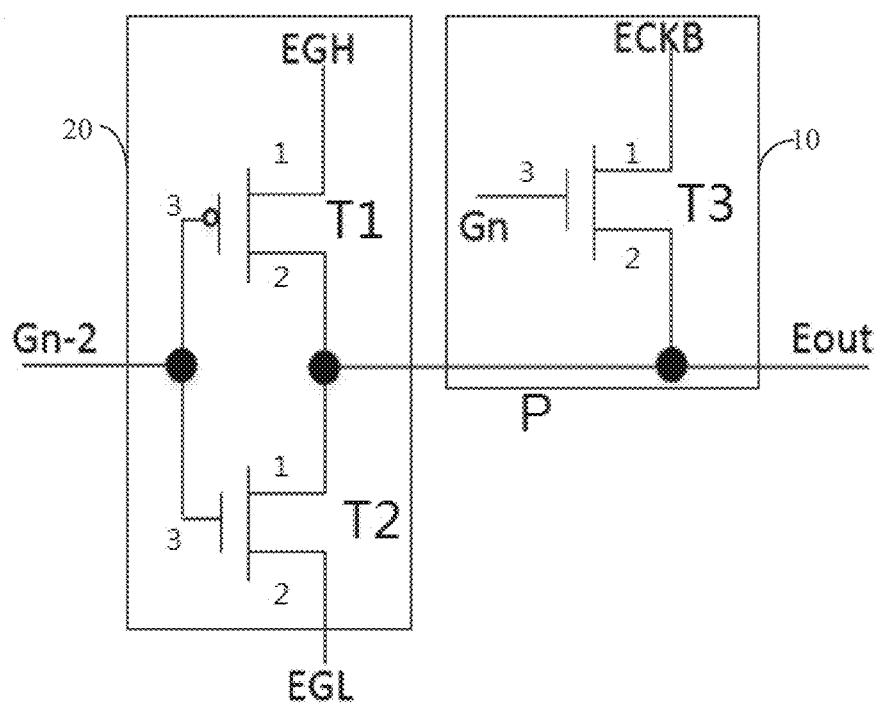
FIG. 2 is a circuit diagram of an EOA circuit according to the present disclosure.

FIG. 2 illustrates a circuit diagram of an EOA circuit according to the present disclosure. The EOA circuit is applicable to a display panel. The display panel includes, but is not limited to, a liquid crystal display (LCD) panel (for example, a TFT-LCD display panel), an OLED display panel, an active-matrix organic light-emitting diode (AMO-LED) display panel, a flexible display panel, or the like.

The EOA circuit may be disposed in a non-display region of the display panel, and generally disposed in a border region of the display panel, for example, left and right sides of the display panel. The EOA circuit according to the present disclosure may be a complementary metal-oxide-semiconductor (CMOS) EOA circuit.

As illustrated in FIG. 2, in this embodiment, the EOA circuit includes an output module 10 and a control module 20. The output module 10 is configured to generate an output signal (Eout) according to a first scanning signal (Gn) and a clock signal (ECKB); and the output module 10 is further configured to reset the output signal (Eout) from a high level to a low level within a period where the first scanning signal (Gn) is at an active level and a period where the clock signal (ECKB) is at an inactive level. The control module 20 is configured to restore the output signal (Eout) from the low level to the high level according to a second scanning signal (Gn−2) within a period where the first scanning signal (Gn) is at the inactive level.

Herein, the period of the active level of the first scanning signal (Gn) is a high level period, and the period of the inactive level of the first scanning signal (Gn) is a low level period. Herein, the period of the active level of the clock signal (ECKB) is a high level period, and the period of the inactive level of the clock signal (ECKB) is a low level period.

Further, in the embodiments of the present disclosure, the output module 10 may be constituted by an N-channel metal-oxide-semiconductor transistor.

Further, in this embodiment, the output module 10 includes an output terminal (Eout) and a third transistor T3 of the EOA circuit.

A first electrode of the third transistor T3 is connected to the clock signal (ECKB), a second electrode of the third transistor T3 is connected to the output terminal (Eout) of the EOA circuit, and a third electrode of the third transistor T3 is connected to the first scanning signal (Gn). It may be understood that the third transistor T3 may be an N-channel metal-oxide-semiconductor transistor, for example, an N-type MOS transistor. The first electrode of the third transistor T3 is a drain of the N-type MOS transistor, the second electrode of the third transistor T3 is a source of the N-type MOS transistor, and the third electrode of the third transistor T3 is a gate of the N-type MOS transistor. In this embodiment, when the first scanning signal (Gn) is at the high level, the third transistor T3 is turned on; and when the first scanning signal (Gn) is at the low level, the third transistor T3 is turned off. In the embodiments of the present disclosure, a size of the third transistor is far greater than a size of a first transistor.

Figure 3:
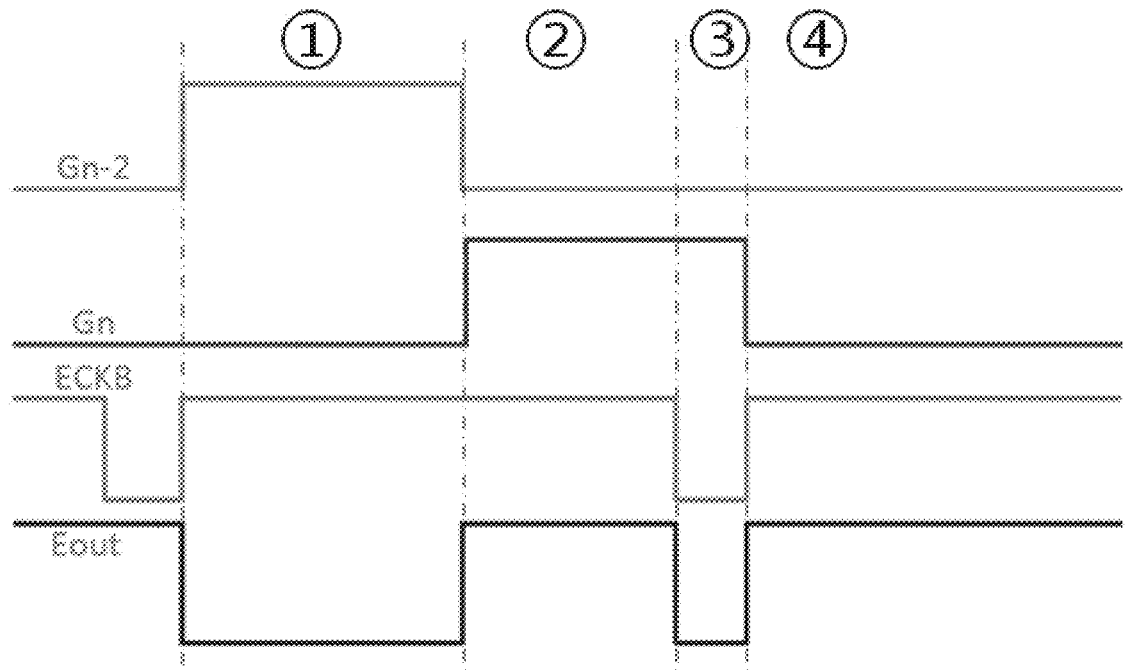
FIG. 3 is a timing diagram of a single-stage EOA circuit according to the present disclosure.

As illustrated in FIG. 3, within a first time period (1), the first scanning signal is at the low level, and the second scanning signal is at the high level. When the first scanning signal at the low level is applied to the third electrode of the third transistor T3, the transistor T3 is turned off, meanwhile when the second scanning signal at the high level is applied to third electrodes of a first transistor T1 and a second transistor T2, the first transistor T1 and the second transistor T2 are turned on. A low level signal pulls down a first electrode of the second transistor T2, meanwhile pulls down a voltage at the output terminal (Eout) of the EOA circuit, such that the output terminal (Eout) of the EOA circuit outputs a low level signal.

Within a second time period (2), when the first scanning signal (Gn) at the high level is applied to the third electrode of the third transistor T3, the third transistor T3 is turned on, meanwhile when the second scanning signal (Gn−2) at the low level is applied to the third electrodes of the first transistor T1 and the second transistor T2, the first transistor T1 is turned on and the second transistor T2 is turned off. The clock signal (ECKB) at the high level is transmitted from the first electrode of the third transistor T3 to the second electrode of the third transistor T3, and transmitted to the output terminal of the EOA circuit. At the same time, a high level signal (EGH) is transmitted from a first electrode of the first transistor T1 to a second electrode of the first transistor T1, and is transmitted to the output terminal (Eout) of the EOA circuit, such that the output terminal (Eout) of the EOA circuit outputs a high level signal.

Preferably, in the embodiments of the present disclosure, the control module 20 may be constituted by an N-channel metal-oxide-semiconductor transistor and a P-channel metal-oxide-semiconductor transistor.

Further, in this embodiment, the control module 20 includes the first transistor T1.

The first electrode of the first transistor T1 is connected to a high level signal (EGH), the second electrode of the first transistor T1 is connected to the second electrode of the third transistor T3, and a third electrode of the first transistor T1 is connected to the second scanning signal (Gn−2). It may be understood that the first transistor T1 may be a P-channel metal-oxide-semiconductor transistor, for example, a P-type MOS transistor. The first electrode of the first transistor T1 is a drain of the P-type MOS transistor, the second electrode of the first transistor T1 is a source of the P-type MOS transistor, and the third electrode of the first transistor T1 is a gate of the P-type MOS transistor. In this embodiment, when the second scanning signal (Gn−2) is at the low level, the first transistor T1 is turned on; and when the second scanning signal (Gn−2) is at the high level, the first transistor T1 is turned off.

Further, the control module 20 further includes the second transistor T2.

The first electrode of the second transistor T2 is connected to the second electrode of the first transistor T1, a second electrode of the second transistor T2 is connected to a low level signal (EGL), and the third electrode of the second transistor T2 is shorted to the third electrode of the first transistor T1 and connected to the second scanning signal (Gn−2). It may be understood that the second transistor T2 may be an N-channel metal-oxide-semiconductor transistor, for example, an N-type MOS transistor. The first electrode of the second transistor T2 is a source of the N-type MOS transistor, the second electrode of the second transistor T2 is a drain of the N-type MOS transistor, and the third electrode of the second transistor T2 is a gate of the N-type MOS transistor. In this embodiment, when the second scanning signal (Gn−2) is at the low level, the second transistor T2 is turned off; and when the second scanning signal (Gn−2) is at the high level, the second transistor T2 is turned on.

Specifically, as illustrated in FIG. 2, the first transistor T1 is a P-type MOS transistor, the second transistor T2 is an N-type MOS transistor, and the gate of the first transistor T1 is shorted to the gate of the second transistor T2. Therefore, when the second scanning signal (Gn−2) is at the low level, the first transistor T1 is turned on, and the second transistor T2 is turned off; and when the second scanning signal (Gn−2) is at the high level, the first transistor T1 is turned off, and the second transistor T2 is turned on.

As illustrated in FIG. 3, within a third time period (3), the first transistor is turned on and the second transistor is turned off when the second scanning signal (Gn−2) at the low level is applied to the third electrode of the first transistor T1 and the third electrode of the second transistor T2, meanwhile the third transistor T3 is turned on when the first scanning signal (Gn) at the high level is applied to the third electrode of the third transistor T3.

The high level signal (EGH) is transmitted from the first electrode of the first transistor T1 to the second electrode of the first transistor T1, and transmitted to the output terminal (Eout) of the EOA circuit. Meanwhile, the clock signal (ECKB) at the low level is transmitted to the second electrode of the third transistor T3 via the first electrode of the third transistor T3, and transmitted to the output terminal (Eout) of the EOA circuit. Since the size of the third transistor T3 is far greater than the size of the first transistor T1, the output terminal (Eout) of the EOA circuit remains at the low level, and hence the output terminal (Eout) of the EOA circuit outputs a low level signal.

Further, FIG. 3 illustrates a diagram of a timing simulation result of a single clock signal (ECKB) of the EOA circuit according to the present disclosure.

As illustrated in FIG. 3, within the time period (1), the second scanning signal (Gn−2) is at the high level, the first scanning signal (Gn) is at the low level, and the clock signal (ECKB) is at the high level. In this case, the third transistor T3 is turned off, the first transistor T1 is turned off, and the second transistor T2 is turned on. The low level signal (EGL) is output to a point P via the second transistor T2, and pulls down the output terminal (Eout) of the EOA circuit to a low level, such that the output terminal (Eout) of the EOA circuit outputs the low level.

Within the time period (2), the second canning signal (Gn−2) is at the low level, the first scanning signal (Gn) is at the high level, and the clock signal (ECKB) is at the high level. In this case, the third transistor T3 is turned on, the first transistor T1 is turned on, and the second transistor T2 is turned off. The clock signal (ECKB) at the high level is input from the first electrode of the third transistor T3 and transmitted to the output terminal (Eout) of the EOA circuit via the second electrode of the third transistor T3, meanwhile the high level signal (EGH) is output to the point P via the first transistor T1, such that the output terminal (Eout) of the EOA circuit outputs the high level signal (EGH) to the display region of the display panel.

Within the time period (3), the second canning signal (Gn−2) is at the low level, the first scanning signal (Gn) is at the high level, and the clock signal (ECKB) is at the low level. In this case, the third transistor T3 is turned on, the first transistor T1 is turned on, and the second transistor T2 is turned off. The clock signal (ECKB) at the low level is applied to the first electrode of the third transistor T3 and output to the point P via the third transistor T3, meanwhile the high level signal (EGH) is output to the point P via the first transistor T1. In this case, since the size of the third transistor T3 is far greater than the size of the first transistor T1, a voltage at the point P remains at the low level, and hence the output terminal (Eout) of the EOA circuit is pulled to a low level, and the high level signal (EGH) at the output terminal (Eout) of the EOA circuit is reset to the low level signal (EGL).

Within the time period (4), the second canning signal (Gn−2) is at the low level, the first scanning signal (Gn) is at the low level, and the clock signal (ECKB) is at the high level. In this case, the third transistor T3 is turned off, the first transistor T1 is turned on, and the second transistor T2 is turned off. The high level signal (EGH) is input from the first electrode of the first transistor T1 and transmitted to the second electrode of the first transistor T1, the high level signal (EGH) is transmitted via the second electrode of the first transistor T1 to the output terminal (Eout) of the EOA circuit, and the output terminal (Eout) is restored from the low level signal to the high level signal.

Figure 4:
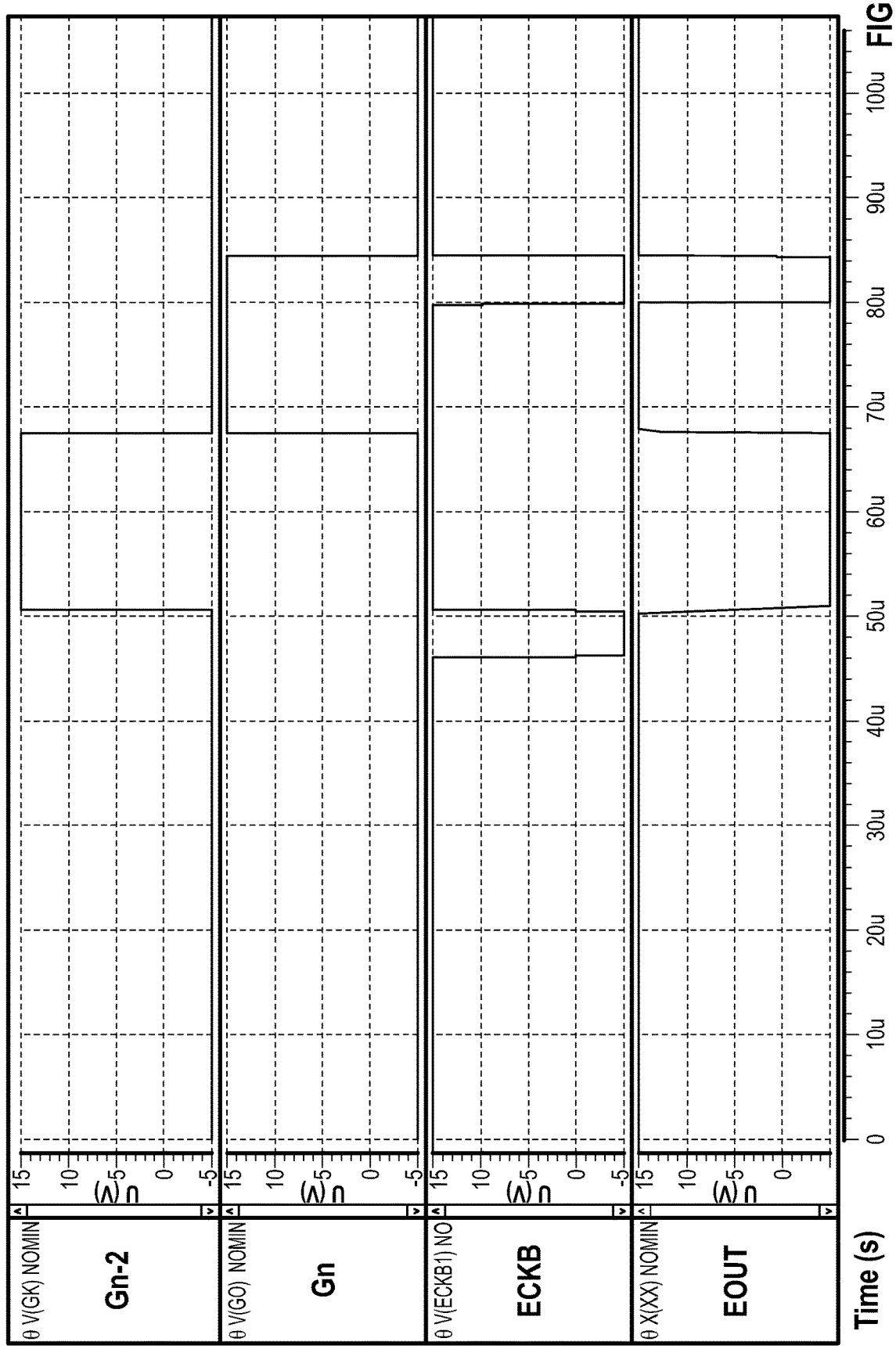
FIG. 4 is a diagram of a simulation result of a single-stage EOA circuit according to the present disclosure.

FIG. 4 illustrates a diagram of a simulation result of a single-stage EOA circuit according to the present disclosure.

As illustrated in FIG. 3 and FIG. 4, the simulation result is equivalent to the timing result.

Figure 5:
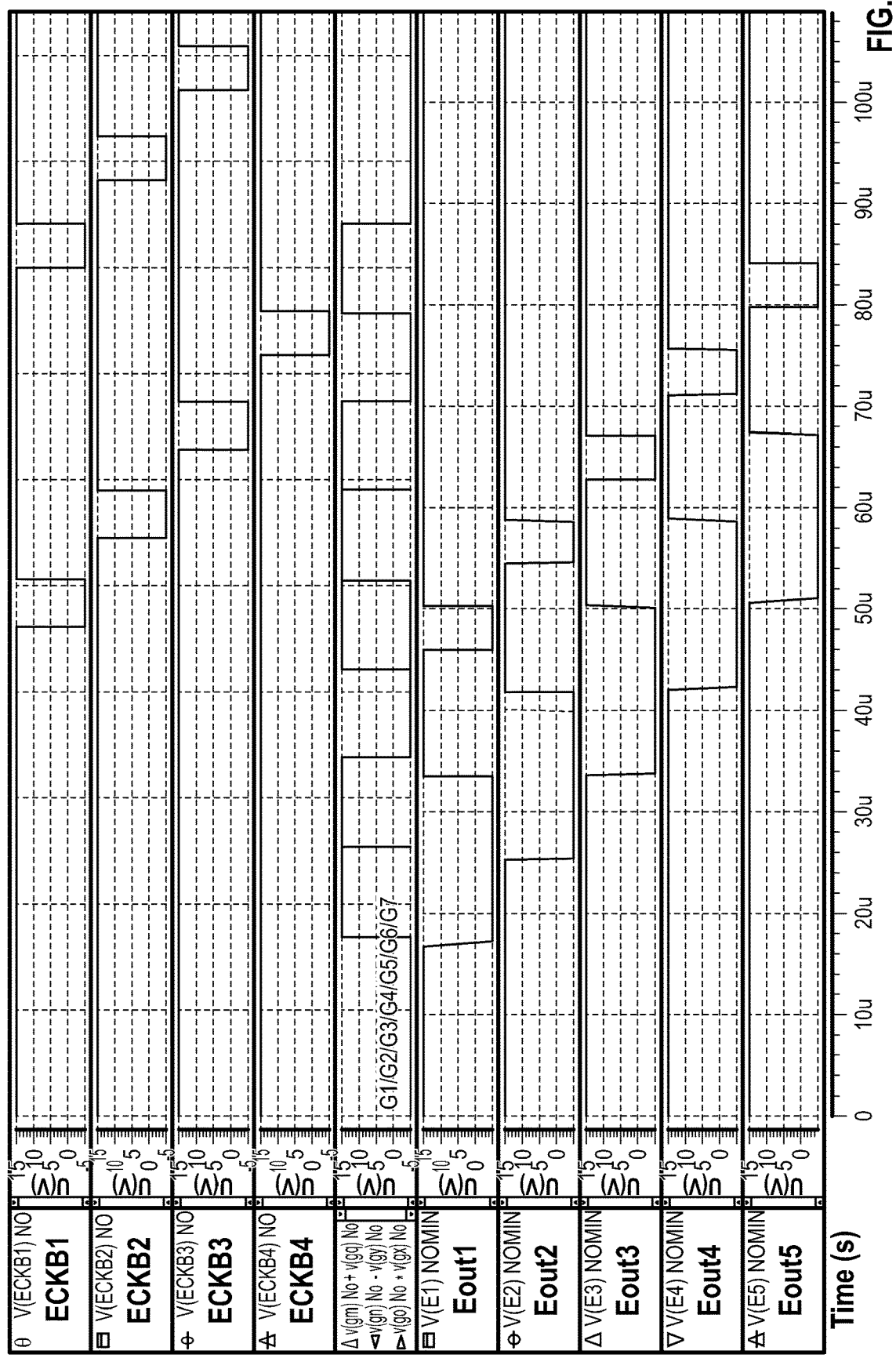
FIG. 5 is a diagram of a simulation result of a timing signal of a multi-stage EOA circuit according to the present disclosure.

With reference to FIG. 5, a simulation result of four clock signals (ECKB) in the EOA circuit according to the present disclosure is illustrated. As illustrated in FIG. 5, the present disclosure achieves outputs of light-emitting signals driving the TFT transistor in the display panel only by employing the above EOA circuit and four clock signal (ECKB) lines.

Figure 1:
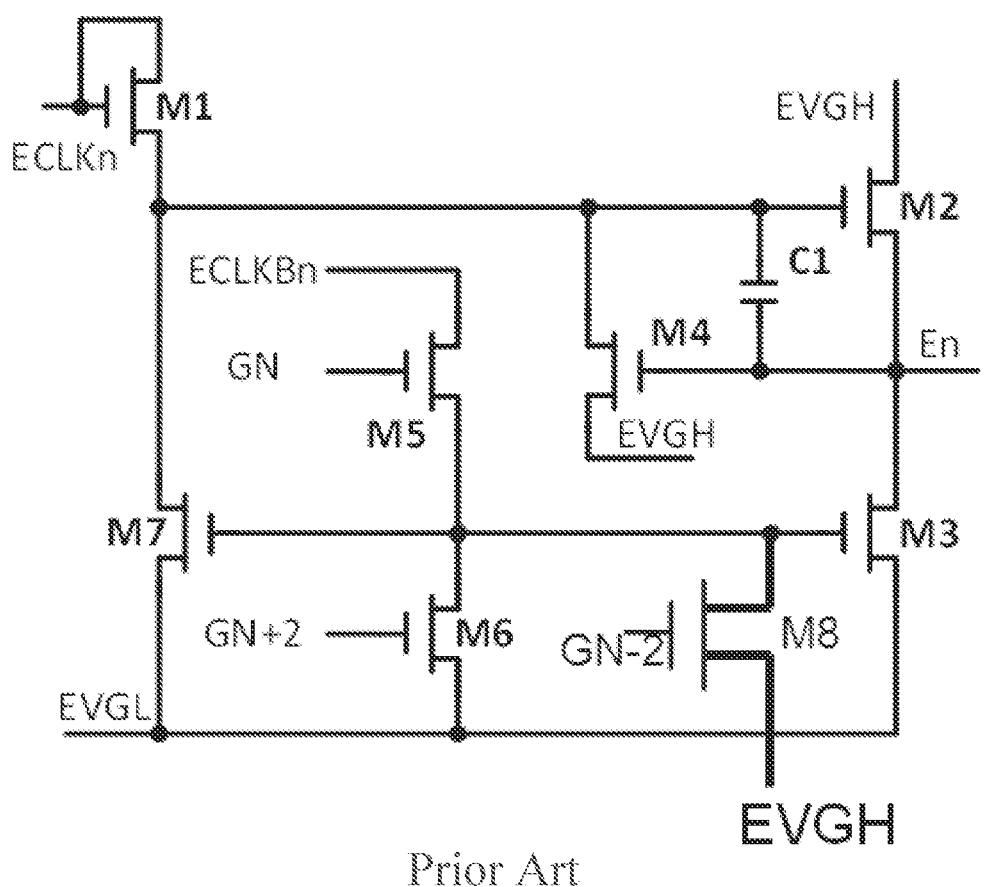
FIG. 1 is a circuit diagram of a conventional 8T1C EOA circuit.
Figure 6:
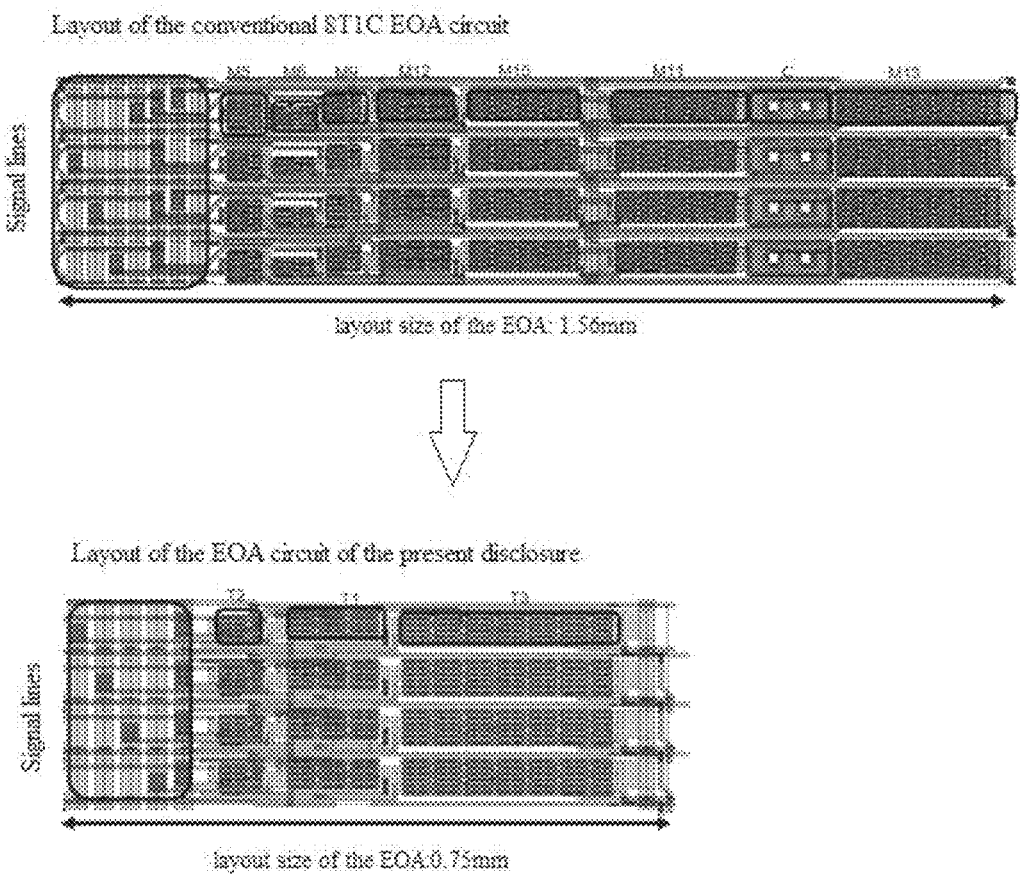
FIG. 6 is a diagram of comparison of layout sizes of an EOA circuit according to the present disclosure and the conventional 8T1C EOA circuit.

In summary, as illustrated in FIG. 1 and FIG. 5, the EOA circuit according to the present disclosure only needs three transistors and four clock signal (ECKB) lines to control output signals of the EOA circuit. As compared with the conventional scheme of 8T1C, four CLK signal lines and two ECLKB signal lines, the EOA circuit according to the present disclosure achieves a higher reliability, reduces the number of transistors, and greatly reduces the number of signal lines. In this way, the circuit structure of the EOA circuit is greatly simplified, and the space occupied by the EOA circuit may be effectively reduced during layout. As illustrated in FIG. 6, a comparison is made between a layout size of the EOA circuit according to the present disclosure and a layout size of the conventional 8T1C EOA circuit. As seen from FIG. 6, the layout size of each stage of EOA circuit according to the present disclosure may be reduced to 0.75 mm, which is reduced by 50% over the conventional EOA circuit, and the layout size of the entire EOA circuit may be reduced by up to 20%. Therefore, the EOA circuit according to the present disclosure effectively reduces the space occupied by EOA circuit layout, and is applicable to narrow-frame design.

The present disclosure further provides a display panel. The display panel includes an EOA circuit disposed in a border region, wherein the EOA circuit disposed in the border region of the display panel is the EOA circuit as described above. The border region is a non-display region of the display panel.

Figure 7:
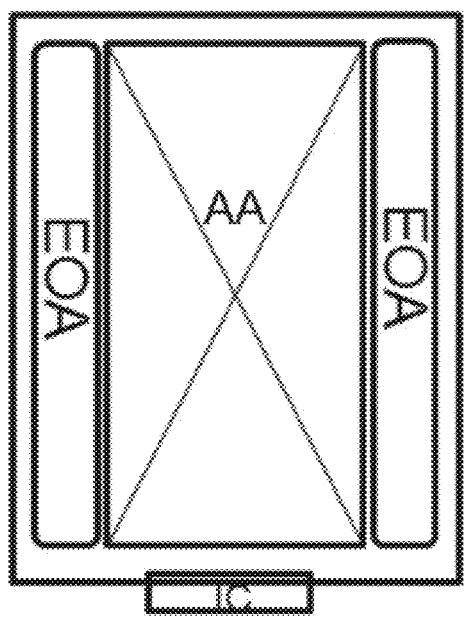
FIG. 7 is a schematic position diagram of an EOA circuit according to the present disclosure.

Referring to FIG. 7, a position diagram of the EOA circuit in a specific embodiment of the present disclosure is illustrated.

As illustrated in FIG. 7, in this embodiment, the display panel includes a display region AA and two EOA circuits. The display region AA is located at a middle position of the display panel, and a region defined by a periphery of the display region AA and an edge of the display panel is a border region. The two EOA circuits are respectively disposed in the border regions on two opposite sides of the display region AA.

In practice, the display panel according to the embodiments of the present disclosure may be a liquid crystal display (for example, a TFT-LCD or the like), or an OLED display panel, or an AMOLED display panel. It may be understood that, in some other embodiments, the display panel according to the embodiments of the present disclosure may also be a display panel of another type, for example, a flexible display panel or the like, which is not limited in the present disclosure.

The present disclosure further provides a terminal. The terminal includes the display panel as described above. The terminal may include, but is not limited to, a smart phone, a tablet computer, a smart watch, a smart wearable device, a smart home device, or the like.

The above embodiments are merely given for illustration of the technical concepts and characteristics of the present disclosure, and are intended to better help persons skilled in the art to understand the content of the present disclosure and practice the technical solutions according to the present disclosure. However, these embodiments are not intended to limit the protection scope of the present disclosure. Any equivalent modifications and polishments made within the protection scope of the appended claims shall be all within the protection scope subject to the appended claims.

It should be understood that persons of ordinary skill in the art may derive improvements or variations according to the above description, and such improvements or variations shall all fall within the protection scope as defined by the claims of the present disclosure.

What is claimed is:

1. An EOA circuit, comprising:
    an output module, configured to generate an output signal according to a first scanning signal and a clock signal; wherein the output module is further configured to reset the output signal from a high level to a low level within a period where the first scanning signal is at an active level and a period where the clock signal is at an inactive level; and
    a control module, configured to restore the output signal from the low level to the high level according to a second scanning signal within a period where the first scanning signal is at the inactive level.

2. The EOA circuit according to claim 1, wherein the output module is constituted by an N-channel metal-oxide-semiconductor transistor.

3. The EOA circuit according to claim 2, wherein the output module comprises:
    an output terminal of the EOA circuit; and
    a third transistor, a first electrode of the third transistor being connected to the clock signal, a second electrode of the third transistor being connected to the output terminal of the EOA circuit, and a third electrode of the third transistor is connected to the first scanning signal.

4. The EOA circuit according to claim 3, wherein the control module comprises:
    a first transistor, a first electrode of the first transistor being connected to a high level signal, a second electrode of the first transistor being connected to the second electrode of the third transistor, and a third electrode of the first transistor is connected to the second scanning signal.

5. The EOA circuit according to claim 4, wherein the control module further comprises:
    a second transistor, a first electrode of the second transistor being connected to the second electrode of the first transistor, a second electrode of the second transistor is connected to a low level signal, and a third electrode of the second transistor is shorted to the third electrode of the first transistor and connected to the second scanning signal.

6. The EOA circuit according to claim 5, wherein the first transistor is a P-channel metal-oxide-semiconductor transistor, and the second transistor is an N-channel metal-oxide-semiconductor transistor.

7. The EOA circuit according to claim 5, wherein the third transistor is turned on when the first scanning signal is at the high level.

8. The EOA circuit according to claim 5, wherein the first transistor is turned off and the second transistor is turned on when the second scanning signal at the high level.

9. The EOA circuit according to claim 5, wherein within a first time period, the first scanning signal is at the low level, and the second scanning signal is at the high level; the third transistor is turned off when the first scanning signal at the low level is applied to the third electrode of the third transistor, meanwhile the first transistor is turned off and the second transistor is turned on when the second scanning signal at the high level is applied to the third electrodes of the first transistor and the second transistor; and the low level signal pulls down the first electrode of the second transistor, meanwhile pulls down a voltage at the output terminal of the EOA circuit, such that the output terminal of the EOA circuit outputs the low level signal.

10. The EOA circuit according to claim 5, wherein within a second time period, the third transistor is turned on when the first scanning signal at the high level is applied to the third electrode of the third transistor, meanwhile the first transistor is turned on and the second transistor is turned off when the second scanning signal at the low level is applied to the third electrodes of the first transistor and the second transistor; and
    the clock signal at the high level is transmitted from the first electrode of the third transistor to the second electrode of the third transistor and transmitted to the output terminal of the EOA circuit, meanwhile the high level signal is transmitted from the first electrode of the first transistor to the second electrode of the first transistor and transmitted to the output terminal of the EOA circuit, such that the output terminal of the EOA circuit outputs the high level signal.

11. The EOA circuit according to claim 5, wherein within a third time period, the first transistor is turned on and the second transistor is turned off when the second scanning signal at the low level is applied to the third electrodes of the first transistor and the second transistor, meanwhile the third transistor is turned on when the first scanning signal at the high level is applied to the third electrode of the third transistor; and
    the high level signal is transmitted from the first electrode of the first transistor to the second electrode of the first transistor and transmitted to the output terminal of the EOA circuit, meanwhile the clock signal at the low level is transmitted from the first electrode of the third transistor to the second electrode of the third transistor and transmitted to the output terminal of the EOA circuit, such that the output terminal of the EOA circuit outputs the low level signal.

12. The EOA circuit according to claim 4, wherein a size of the third transistor is greater than a size of the first transistor.

13. The EOA circuit according to claim 1, wherein the control module is constituted by an N-channel metal-oxide-semiconductor transistor and a P-channel metal-oxide-semiconductor transistor.

14. The EOA circuit according to claim 1, wherein the EOA circuit is a CMOS EOA circuit.

15. A display panel, comprising an EOA circuit disposed in a border region, wherein the EOA circuit comprises:
    an output module, configured to generate an output signal according to a first scanning signal and a clock signal; wherein the output module is further configured to reset the output signal from a high level to a low level within a period where the first scanning signal is at an active level and a period where the clock signal is at an inactive level; and a control module, configured to restore the output signal from the low level to the high level according to a second scanning signal within a period where the first scanning signal is at the inactive level.

16. The display panel according to claim 15, wherein the display panel is a liquid crystal display panel.

17. The display panel according to claim 15, wherein the display panel is an OLED display panel.

18. The display panel according to claim 15, wherein the display panel is an AMOLED display panel.

19. A terminal, comprising a display panel with an EOA circuit disposed in a border region of the display panel; wherein the EOA circuit comprises: an output module, configured to generate an output signal according to a first scanning signal and a clock signal; wherein the output module is further configured to reset the output signal from a high level to a low level within a period where the first scanning signal is at an active level and a period where the clock signal is at an inactive level; and a control module, configured to restore the output signal from the low level to the high level according to a second scanning signal within a period where the first scanning signal is at the inactive level.

20. The terminal according to claim 19, wherein the display panel is liquid crystal display panel, OLED display panel or AMOLED display panel.

\* \* \* \* \*